United States Patent
Sekiya

(10) Patent No.: US 10,872,791 B2
(45) Date of Patent: Dec. 22, 2020

(54) TAPE ATTACHING METHOD AND TAPE ATTACHING APPARATUS

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/282,872

(22) Filed: Feb. 22, 2019

(65) Prior Publication Data

US 2019/0267264 A1    Aug. 29, 2019

(30) Foreign Application Priority Data

Feb. 27, 2018  (JP) ................................. 2018-033685

(51) Int. Cl.
*H01L 21/67* (2006.01)
*B32B 38/00* (2006.01)

(52) U.S. Cl.
CPC .... *H01L 21/67132* (2013.01); *B32B 38/0004* (2013.01); *Y10T 156/1057* (2015.01)

(58) Field of Classification Search
CPC ......... H01L 21/67132; Y10T 156/1057; B32B 38/0004
See application file for complete search history.

(56) References Cited

U.S. PATENT DOCUMENTS 9,142,441 B2 * 9/2015 Yamamoto .......... H01L 21/6835
2008/0184855 A1 * 8/2008 Yamamoto ............ B26F 1/3846
83/27

FOREIGN PATENT DOCUMENTS

JP          2015095620 A      5/2015

* cited by examiner

*Primary Examiner* — Mark A Osele
*Assistant Examiner* — Christopher C Caillouet
(74) *Attorney, Agent, or Firm* — Greer Burns & Crain Ltd.

(57) ABSTRACT

A tape attaching method for mounting an adhesive tape to an annular frame having an inside opening to thereby support a plate-shaped workpiece through the adhesive tape to the frame in the inside opening thereof. The tape attaching method includes an adhesive tape attaching step of attaching the adhesive tape to the workpiece, the adhesive tape being larger in size than the frame, a frame positioning step of positioning the frame with a spacing defined between the frame and the adhesive tape in the condition where the inside opening of the frame is opposed to the workpiece attached to the adhesive tape, and a tape attaching and cutting step of partially pressing the adhesive tape against the frame by using a roller rotating along the inner circumference of the frame defining the inside opening.

4 Claims, 8 Drawing Sheets

TAPE ATTACHING METHOD AND TAPE ATTACHING APPARATUS

BACKGROUND OF THE INVENTION

Field of the Invention

The present invention relates to a tape attaching method and a tape attaching apparatus.

Description of the Related Art

In processing various kinds of plate-shaped workpieces including a semiconductor wafer, package substrate, glass substrate, and ceramic substrate, by using a cutting blade or a laser or in breaking the workpiece by applying an external force, the workpiece is fixed through an adhesive tape (dicing tape or expandable tape) to an annular frame, so as to improve the handleability of the workpiece. In fixing the workpiece through the adhesive tape to the frame, the adhesive tape is pressed on the whole of one side surface of the frame by using a roller or the like and thereby fully attached to the frame. Thereafter, the adhesive tape is circularly cut along the frame by using a cutter. Thereafter, an unwanted peripheral part of the adhesive tape cut along the frame is peeled from the frame (see JP2015-95620A, for example).

SUMMARY OF THE INVENTION

In the method described in JP2015-95620A, an adhesive layer of the adhesive tape peeled from the frame may be left on the frame in its peripheral portion. Further, the frame may be damaged by the cutter, causing a decrease in number of repetitions of use of the frame. When the adhesive layer of the adhesive tape is left on the peripheral portion of the frame, there arises a problem such that the adhesive tape attached to the frame cannot be easily peeled after using the frame.

It is therefore an object of the present invention to provide a tape attaching method and a tape attaching apparatus which can suppress possible damage to the frame by the cutter.

In accordance with an aspect of the present invention, there is provided a tape attaching method for mounting an adhesive tape to an annular frame having an inside opening to thereby support a plate-shaped workpiece through the adhesive tape to the frame in the inside opening of the frame, the tape attaching method including an adhesive tape attaching step of attaching the adhesive tape to the workpiece, the adhesive tape being larger in size than the frame; a frame positioning step of positioning the frame with a spacing defined between the frame and the adhesive tape in the condition where the inside opening of the frame is opposed to the workpiece attached to the adhesive tape; and a tape attaching and cutting step of partially pressing the adhesive tape against the frame by using a roller rotating along the inner circumference of the frame defining the inside opening, the adhesive tape being previously spaced from the frame, thereby partially attaching the adhesive tape to the frame, and also cutting the adhesive tape in an area not coming into contact with the frame on the axial outside of the roller by using a cutter having a cutting edge in the condition where the cutting edge of the cutter is not in contact with the frame, the cutter being arranged adjacent to the roller on the radial outside of the frame.

Preferably, the roller includes a hard area arranged on the radial inside of the frame and a soft area arranged on the radial outside of the frame, the soft area being softer than the hard area.

In accordance with another aspect of the present invention, there is provided a tape attaching apparatus for mounting an adhesive tape to an annular frame having an inside opening to thereby support a plate-shaped workpiece through the adhesive tape to the frame in the inside opening of the frame, the tape attaching apparatus including an adhesive tape fixing unit holding the adhesive tape to which the workpiece is previously attached, the adhesive tape being larger in size than the frame; a frame fixing unit positioning the frame with a spacing defined between the frame and the adhesive tape in the condition where the inside opening of the frame is opposed to the workpiece attached to the adhesive tape; and a tape attaching and cutting unit attaching the adhesive tape to the frame held by the frame fixing unit and also cutting the adhesive tape along the frame; the tape attaching and cutting unit including a roller for partially pressing the adhesive tape against the frame, the adhesive tape being previously spaced from the frame, the roller being adapted to rotate along the inner circumference of the frame defining the inside opening; and a cutter having a cutting edge for cutting the adhesive tape in an area not coming into contact with the frame on the axial outside of the roller, the roller pressing the adhesive tape on the frame, in the condition where the cutting edge of the cutter is not in contact with the frame, the cutter being arranged adjacent to the roller on the radial outside of the frame.

Preferably, the roller includes a hard area arranged on the radial inside of the frame and a soft area arranged on the radial outside of the frame, the soft area being softer than the hard area. Preferably, the adhesive tape fixing unit includes a tape moving unit moving the adhesive tape away from the frame held by the frame fixing unit.

The present invention can exhibit an effect that possible damage to the frame by the cutter may be suppressed.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

Preferred Embodiment

Figure 1:
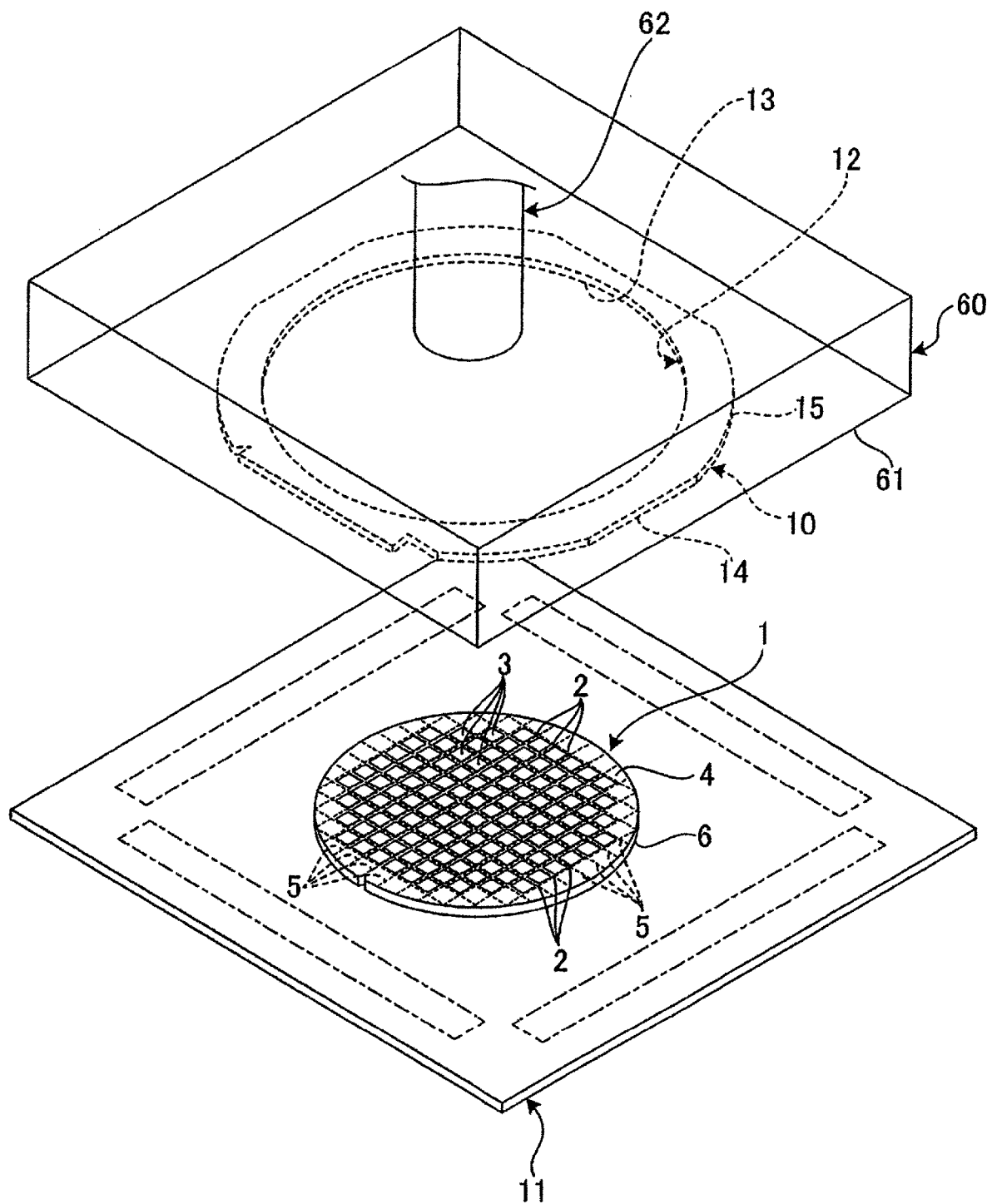
FIG. 1 is a perspective view depicting a workpiece as an object to be processed in a tape attaching method according to a preferred embodiment of the present invention.
Figure 2:
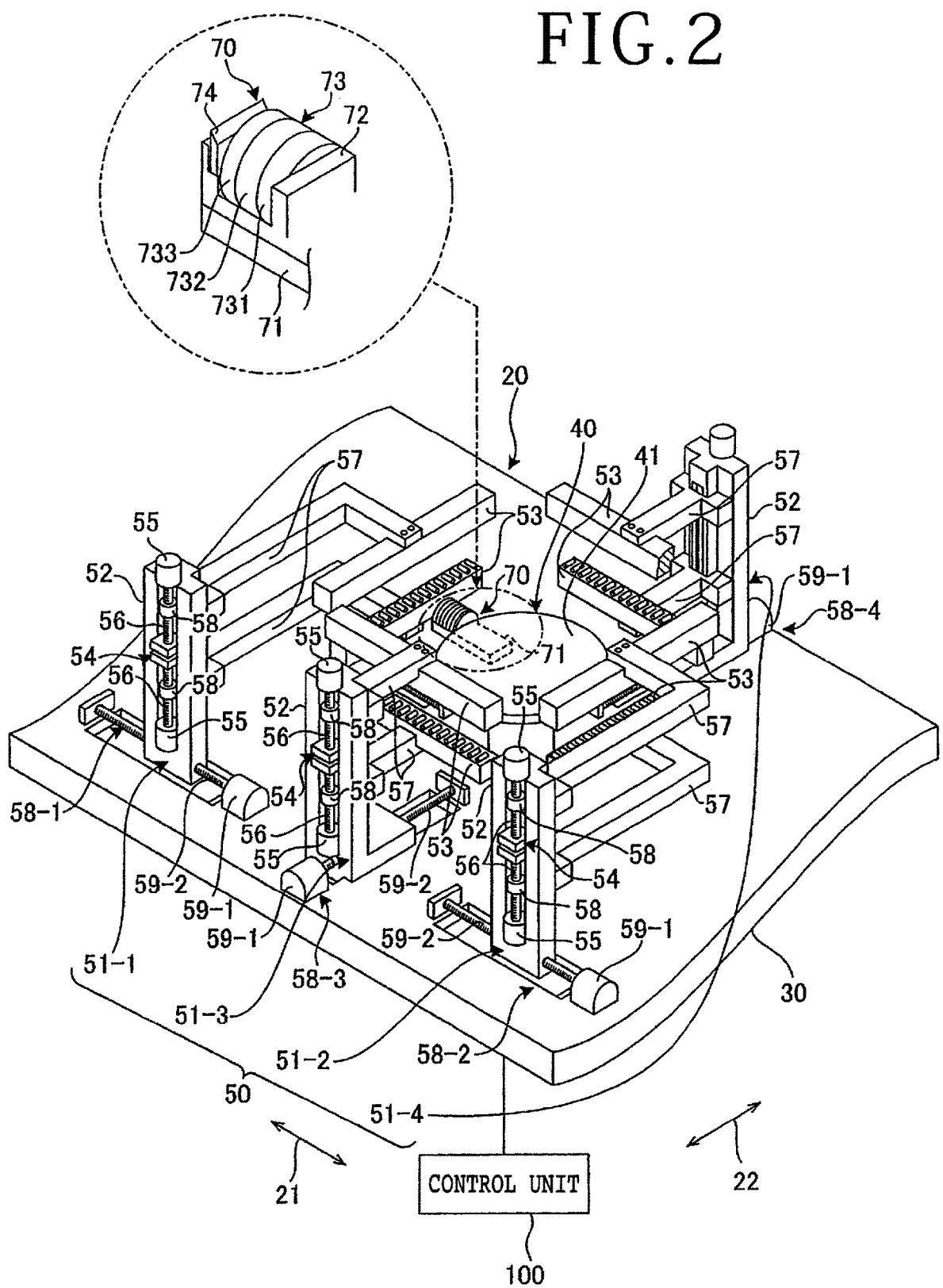
FIG. 2 is a perspective view depicting the configuration of a tape attaching apparatus according to this preferred embodiment.
Figure 3:
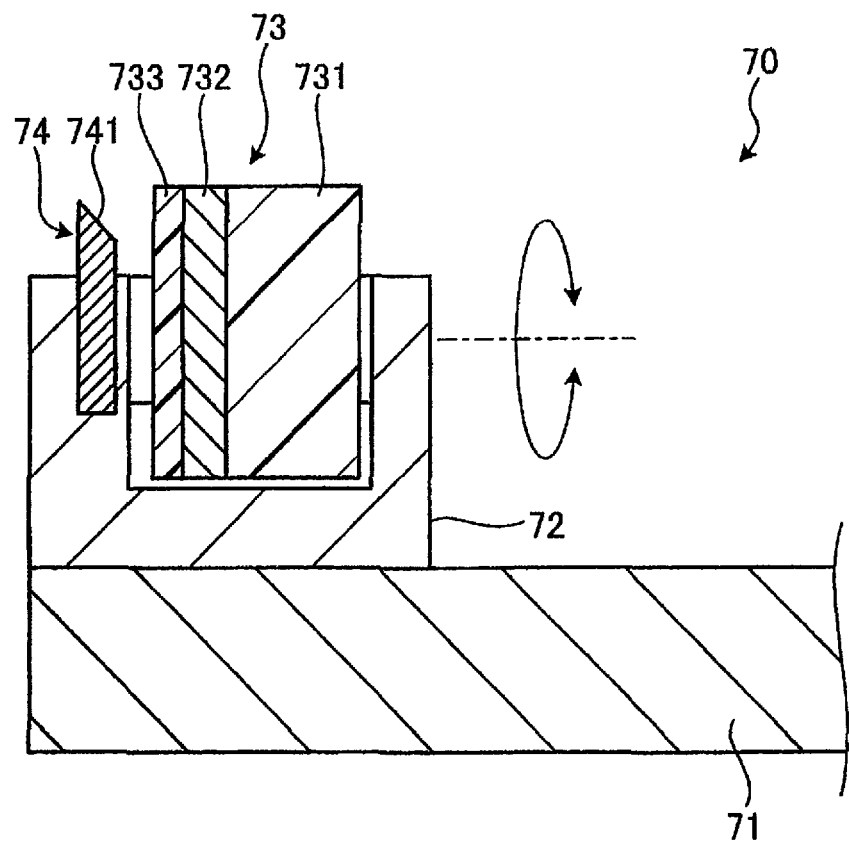
FIG. 3 is a sectional view of an essential part of a tape attaching and cutting unit included in the tape attaching apparatus depicted in FIG. 2.
Figure 4:
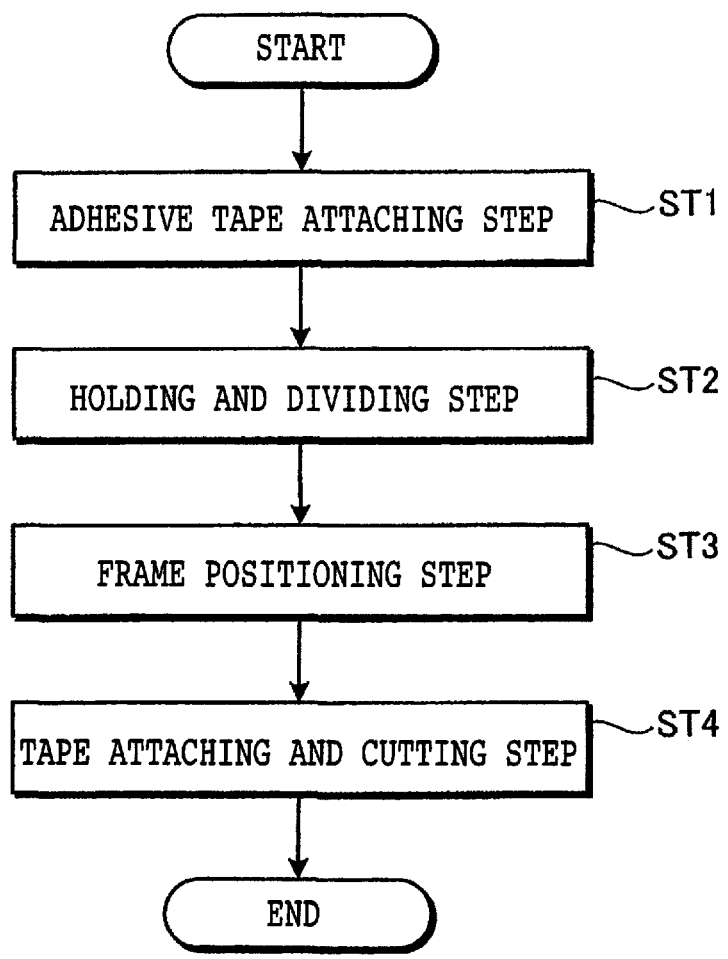
FIG. 4 is a flowchart depicting the flow of the tape attaching method according to this preferred embodiment.

There will now be described a tape attaching method and a tape attaching apparatus according to a preferred embodiment of the present invention with reference to the drawings. FIG. 1 is a perspective view depicting a workpiece as an object to be processed in the tape attaching method according to this preferred embodiment. FIG. 2 is a perspective view depicting the configuration of the tape attaching apparatus according to this preferred embodiment. FIG. 3 is a sectional view of an essential part of a tape attaching and cutting unit included in the tape attaching apparatus depicted in FIG. 2. FIG. 4 is a flowchart depicting the flow of the tape attaching method according to this preferred embodiment.

The tape attaching method according to this preferred embodiment is a method of mounting an adhesive tape 11 to an annular frame 10 having an inside opening 12 to thereby support a plate-shaped workpiece 1 through the adhesive tape 11 to the frame 10. The workpiece 1 to be supported through the adhesive tape 11 to the frame 10 in the inside opening 12 of the frame 10 by the tape attaching method according to this preferred embodiment is a disk-shaped semiconductor wafer or optical device wafer having a substrate formed of silicon, sapphire, gallium arsenide, or silicon carbide (SiC), for example. As depicted in FIG. 1, the workpiece 1 has a front side (upper surface) 4 where a plurality of linear crossing division lines 2 are formed to define a plurality of rectangular separate areas where a plurality of devices 3 are respectively formed. Reference numeral 6 denotes a back side (lower surface) opposite to the front side 4.

Further, a modified layer 5 (depicted by a broken line in FIG. 1) as a break start point is formed inside the workpiece 1 so as to extend along each division line 2. The modified layer 5 is formed by applying a laser beam having a transmission wavelength to the workpiece 1 along each division line 2 from the back side 6 of the workpiece 1. The adhesive tape 11 is attached to the back side 6 of the workpiece 1. Thereafter, the adhesive tape 11 is expanded outwardly to thereby divide the workpiece 1 into the individual devices 3 along the division lines 2 where the modified layers 5 are respectively formed. That is, the workpiece 1 starts to be broken at the modified layers 5. Thusly, the workpiece 1 is divided into the individual devices 3, so that a spacing is defined between any adjacent ones of the individual devices 3. In this condition, the adhesive tape 11 is attached to the frame 10, so that the workpiece 1 is supported through the adhesive tape 11 to the frame 10 in the inside opening 12 thereof.

Each modified layer 5 means an area where physical properties such as density, refractive index, and mechanical strength are different from those in its surrounding area. Examples of each modified layer 5 include a melted (fused) area, crack area, dielectric breakdown area, and refractive index changed area, and mixture of these areas. While the modified layer 5 is formed as a break start point inside the workpiece 1 so as to extend along each division line 2 in this preferred embodiment, a cut groove may be formed as a break start point on the front side 4 of the workpiece 1 so as to extend along each division line 2 by using a cutting apparatus. As another method, laser ablation may be applied to the front side 4 of the workpiece 1 to form a laser processed groove as a break start point along each division line 2. The inside opening 12 of the frame 10 is circular as viewed in plan. The frame 10 has an inner circumference 13 and an outer circumference 15, and the inside opening 12 is defined by the inner circumference 13 of the frame 10. Reference numeral 14 denotes a lower surface of the frame 10. The adhesive tape 11 has a base layer formed of a synthetic resin and an adhesive layer formed on the base layer. The adhesive layer of the adhesive tape 11 is attached to the back side 6 of the workpiece 1 and the lower surface 14 of the frame 10.

Referring to FIG. 2, there is depicted a tape attaching apparatus 20 according to this preferred embodiment. The tape attaching apparatus 20 is an apparatus for expanding the adhesive tape 11 both in a first direction 21 and in a second direction 22 perpendicular to the first direction 21, in which the adhesive tape 11 is previously attached to the back side 6 of the workpiece 1 in which the modified layer 5 is previously formed along each division line 2, thereby dividing the workpiece 1 into the individual devices 3. The tape attaching apparatus 20 also functions as an apparatus for mounting the adhesive tape 11 to the frame 10, in which the back side 6 of the workpiece 1 divided into the individual devices 3 is attached to the adhesive tape 11, thereby supporting the workpiece 1 through the adhesive tape 11 to the frame 10 in the inside opening 12 thereof.

As depicted in FIG. 2, the tape attaching apparatus 20 includes a flat plate-shaped fixed base 30, a holding table 40 provided on the fixed base 30 at the center thereof, an adhesive tape fixing unit 50, a frame fixing unit 60 depicted in FIG. 1, a tape attaching and cutting unit 70, and a control unit 100.

The holding table 40 is a disk-shaped member having a flat upper surface 41 extending in a horizontal plane. The upper surface 41 of the holding table 40 functions as a holding surface for holding the workpiece 1 through the adhesive tape 11. In this preferred embodiment, the back side 6 of the workpiece 1 has already been attached to the adhesive tape 11 to be held on the upper surface 41 of the holding table 40, and the workpiece 1 has already been positioned at the center of the adhesive tape 11. As depicted in FIG. 1, the adhesive tape 11 is rectangular as viewed in plan and larger in size than the frame 11.

The adhesive tape fixing unit 50 functions to hold the adhesive tape 11 to which the workpiece 1 is previously attached, in which the adhesive tape 11 is larger in size than the frame 10 as viewed in plan. The adhesive tape fixing unit 50 includes a first holding unit 51-1, a second holding unit 51-2, a third holding unit 51-3, and a fourth holding unit 51-4. The first holding unit 51-1 and the second holding unit 51-2 are opposed to each other in the first direction 21 so as to interpose the holding table 40 therebetween. The third holding unit 51-3 and the fourth holding unit 51-4 are opposed to each other in the second direction 22 so as to interpose the holding table 40 therebetween.

Each of the first, second, third, and fourth holding units 51-1, 51-2, 51-3, and 51-4 functions to hold the workpiece 1 by nipping the adhesive tape 11 at a position outside the workpiece 1 as depicted by a phantom line in FIG. 1. All of the first, second, third, and fourth holding units 51-1, 51-2, 51-3, and 51-4 have substantially the same configuration. Accordingly, substantially the same parts are denoted by the same reference numerals.

Each of the first, second, third, and fourth holding units 51-1, 51-2, 51-3, and 51-4 includes a columnar movable base 52 provided on the fixed base 30, a pair of nipping members 53 provided on the movable base 52 so as to be vertically movable, and a tape moving unit 54 for moving the pair of nipping members 53 in vertically opposite directions such that the nipping members 53 are movable toward and away from each other. The pair of nipping members 53 are spaced from each other in the vertical direction. When the pair of nipping members 53 are moved toward each other by the tape moving unit 54, the adhesive tape 11 is nipped by the pair of nipping members 53 and accordingly held thereby. The tape moving unit 54 is provided on the movable base 52.

The tape moving unit 54 includes a pair of motors 55 for respectively moving the pair of nipping members 53 in the vertical direction, a pair of ball screws 56 adapted to be respectively rotated about their axes by the pair of motors 55, and a pair of nuts 58 respectively threadedly engaged with the pair of ball screws 56 and connected through a pair of arm members 57 to the pair of nipping members 53. Accordingly, when the motors 55 are operated to rotate the ball screws 56 about their axes, all of the nuts 58, the arm members 57, and the nipping members 53 are vertically moved.

Further, by suitably operating the motors 55 to rotate the ball screws 56 about their axes, the pair of nipping members 53 can also be moved in the vertically same direction. Accordingly, by lowering the pair of nipping members 53 in the condition where the adhesive tape 11 is nipped by the pair of nipping members 53, the adhesive tape 11 can be moved away from the frame 10 held by the frame fixing unit 60 in the vertical direction.

The movable base 52 supporting the pair of nipping members 53 and the tape moving unit 54 of the first holding unit 51-1 is supported to the fixed base 30 so as to be movable in the first direction 21 by a first moving unit 58-1. Similarly, the movable base 52 supporting the pair of nipping members 53 and the tape moving unit 54 of the second holding unit 51-2 is supported to the fixed base 30 so as to be movable in the first direction 21 by a second moving unit 58-2. On the other hand, the movable base 52 supporting the pair of nipping members 53 and the tape moving unit 54 of the third holding unit 51-3 is supported to the fixed base 30 so as to be movable in the second direction 22 by a third moving unit 58-3. Similarly, the movable base 52 supporting the pair of nipping members 53 and the tape moving unit 54 of the fourth holding unit 51-4 is supported to the fixed base 30 so as to be movable in the second direction 22 by a fourth moving unit 58-4.

All of the first, second, third, and fourth moving units 58-1, 58-2, 58-3, and 58-4 have substantially the same configuration. Accordingly, substantially the same parts are denoted by the same reference numerals.

The first moving unit 58-1 has a motor 59-1 for moving the first holding unit 51-1 in the first direction 21 and a ball screw 59-2 adapted to be rotated about its axis by the motor 59-1, thereby moving the movable base 52 of the first holding unit 51-1 in the first direction 21. Similarly, the second moving unit 58-2 has a motor 59-1 for moving the second holding unit 51-2 in the first direction 21 and a ball screw 59-2 adapted to be rotated about its axis by the motor 59-1, thereby moving the movable base 52 of the second holding unit 51-2 in the first direction 21. On the other hand, the third moving unit 58-3 has a motor 59-1 for moving the third holding unit 51-3 in the second direction 22 and a ball screw 59-2 adapted to be rotated about its axis by the motor 59-1, thereby moving the movable base 52 of the third holding unit 51-3 in the second direction 22. Similarly, the fourth moving unit 58-4 has a motor 59-1 for moving the fourth holding unit 51-4 in the second direction 22 and a ball screw 59-2 adapted to be rotated about its axis by the motor 59-1, thereby moving the movable base 52 of the fourth holding unit 51-4 in the second direction 22.

Referring back to FIG. 1, the frame fixing unit 60 is a thick flat plate-shaped member having a lower surface 61 for fixing the frame 10. The frame fixing unit 60 is adapted to be vertically movable by an elevating unit 62. The frame fixing unit 60 functions to horizontally position the frame 10 fixed to the lower surface 61 of the frame fixing unit 60 in such a manner that the inner circumference 13 of the frame 10 becomes coaxial with the holding table 40. Accordingly, the inside opening 12 of the frame 10 is vertically opposed to the workpiece 1 attached to the adhesive tape 11 held on the holding table 40. Further, the frame fixing unit 60 also functions to vertically position the frame 10 by operating the elevating unit 62 in such a manner that when the frame fixing unit 60 is lowered by the elevating unit 62, the lower surface 14 of the frame 10 comes close to the adhesive tape 11 with a spacing being defined therebetween.

The tape attaching and cutting unit 70 functions to attach the adhesive tape 11 to the frame 10 held by the frame fixing unit 60 and also to cut the adhesive tape 11 along the frame 10. As depicted in FIG. 3, the tape attaching and cutting unit 70 includes an arm member 71, a holder member 72 fixed to the arm member 71, a roller 73 rotatably supported to the holder member 72, and a cutter 74 fixed to the holder member 72.

The arm member 71 is located below the holding table 40 and extends parallel to the radial direction of the holding table 40. The arm member 71 has one longitudinal end located below the center of the holding table 40, and the arm member 71 is rotatable about this one longitudinal end by a driving unit (not depicted). When the arm member 71 is rotated by the driving unit, the other longitudinal end of the arm member 71 describes a circular movement path coaxial with the holding table 40. Further, the arm member 71 is also vertically movable by this driving unit. The other longitudinal end of the arm member 71 is located radially outside of the holding table 40. The holder member 72 is fixed to the upper surface of the arm member 71 at the other longitudinal end thereof. When the arm member 71 is raised by the driving unit, the holder member 72 takes a position between the outer circumference 15 and the inner circumference 13 of the frame 10 (see FIG. 7).

The roller 73 is a cylindrical member, and the axis of the roller 73 extends parallel to the longitudinal direction of the arm member 71. The roller 73 is supported to the holder member 72 so as to be rotatable about the axis of the roller 73. When the arm member 71 is rotated about its longitudinal one end by the driving unit, the roller 73 rotatably supported to the holder member 72 is rotated about the longitudinal one end of the arm member 71 as viewed in plan to take a circular movement path along the inner circumference 13 of the frame 10.

When the arm member 71 is lowered by the driving unit, the roller 73 is moved away from the frame 10 in the vertical direction. Accordingly, even when the frame fixing unit 60 is lowered, the roller 73 is opposed to the frame 10 fixed to the frame fixing unit 60 so as to be spaced therefrom in the vertical direction. That is, the roller 73 is opposed to the lower surface 14 of the frame 10 between the inner circumference 13 and the outer circumference 15 in the condition where the adhesive tape 11 is interposed between the frame 10 and the roller 73. Further, when the arm member 71 is raised by the driving unit in the condition where the frame fixing unit 60 is lowered, the roller 73 functions to press the adhesive tape 11 against the frame 10, in which the adhesive tape 11 is previously held by the adhesive tape fixing unit 50. Further, when the arm member 71 is rotated about its longitudinal one end in the condition where the frame fixing unit 60 is lowered and the arm member 71 is raised, the roller 73 functions to press the adhesive tape 11 against the frame 10 over the whole of the inner circumference 13 of the frame 10, thereby attaching the adhesive tape 11 to the frame 10 over the whole of the inner circumference 13 of the frame 10.

As depicted in FIG. 3, the roller 73 includes a hard resin roller 731, a hard metal roller 732, and a soft resin roller 733 axially arranged in this order from the center of the rotation path of the arm member 71. The hard resin roller 731 and the hard metal roller 732 correspond to the hard area of the roller in the present invention, and the soft resin roller 733 corresponds to the soft area of the roller in the present invention. All of the hard resin roller 731, the hard metal roller 732, and the soft resin roller 733 have the same outer diameter in the condition where they are not deformed. Further, all of these rollers 731, 732, and 733 are coaxially arranged. The hard resin roller 731 is located radially inside of the frame 10 fixed to the frame fixing unit 60. The thickness of the hard resin roller 731 in the axial direction thereof is greater than the thickness of the hard metal roller 732 and the thickness of the soft resin roller 733. The soft resin roller 733 is located radially outside of the frame 10 fixed to the frame fixing unit 60. That is, the soft resin roller 733 is located outside the hard resin roller 731 in the axial direction thereof. Both the hard resin roller 731 and the soft resin roller 733 are formed of a foamed resin like a so-called sponge. The hardness of the soft resin roller 733 is lower than the hardness of the hard resin roller 731. In other words, the soft resin roller 733 is softer than the hard resin roller 731. The hard metal roller 732 is formed of metal such as stainless steel and harder than both the hard resin roller 731 and the soft resin roller 733.

The cutter 74 has a cutting edge 741 capable of cutting the adhesive tape 11. The cutter 74 is fixed to the holder member 72 in the condition where the cutting edge 741 is directed upwardly. The cutter 74 is located outside the roller 73 in the axial direction thereof. That is, the cutter 74 is located radially outside of the frame 10 on the axial outside of the roller 73. The cutting edge 741 of the cutter 74 is set at a vertical position lower than that of the upper end of the roller 73. The cutting edge 741 of the cutter 74 is opposed to the lower surface 14 of the frame 10 between the inner circumference 13 and the outer circumference 15 of the frame 10 in the condition where the adhesive tape 11 is interposed between the frame 10 and the cutter 74. Thus, the cutter 74 is located axially outside of the roller 73, and the cutting edge 741 is lower in vertical position than the upper end of the roller 73. Accordingly, when the frame fixing unit 60 is lowered and the arm member 71 is raised, the adhesive tape 11 is pressed on the frame 10 by the roller 73, and at the same time the adhesive tape 11 is cut by the cutting edge 741 in an area not coming into contact with the frame 10 on the axial outside of the roller 73. That is, the cutting edge 741 of the cutter 74 functions to cut the adhesive tape 11 without contact with the frame 10. Further, the cutting edge 741 of the cutter 74 is opposed to the lower surface 14 of the frame 10 between the inner circumference 13 and the outer circumference 15 of the frame 10 in the condition where the adhesive tape 11 is interposed between the frame 10 and the cutter 74. Accordingly, the adhesive tape 11 is cut by the cutting edge 741 at a position between the inner circumference 13 and the outer circumference 15 of the frame 10, and there is no possibility that the adhesive tape 11 attached to the frame 10 may project outward from the outer circumference 15 of the frame 10.

The control unit 100 functions to control each component of the tape attaching apparatus 20 in the operation of expanding the adhesive tape 11 and attaching the adhesive tape 11 to the frame 10. The control unit 100 is a computer having a computing section having a microprocessor such as central processing unit (CPU), a storing section having a memory such as read only memory (ROM) and random access memory (RAM), and input/output interface section. The computing section of the control unit 100 functions to perform computing according to a computer program stored in the storing section and then output a control signal through the input/output interface section to each component of the tape attaching apparatus 20, thereby controlling the tape attaching apparatus 20. Further, connected to the control unit 100 are a display unit (not depicted) such as a liquid crystal display apparatus for displaying various kinds of information and images and an input unit (not depicted) to be used in an input operation such that information on the content of processing (content processing information), for example, is recorded by an operator through the input unit. For example, the input unit includes at least one of a touch panel included in the display unit and an external input apparatus such as a keyboard.

As depicted in FIG. 4, the tape attaching method includes an adhesive tape attaching step ST1, a holding and dividing step ST2, a frame positioning step ST3, and a tape attaching and cutting step ST4.

(Adhesive Tape Attaching Step)

The adhesive tape attaching step ST1 is the step of attaching the adhesive tape 11 to the workpiece 1, the adhesive tape 11 being larger in size than the frame 10. In the adhesive tape attaching step ST1, the back side 6 of the workpiece 1 is attached to the rectangular adhesive tape 11 at its central portion by using a known mounter apparatus or the like, the workpiece 1 being previously formed with the modified layer 5 extending along each division line 2. After attaching the adhesive tape 11 to the workpiece 1 as described above, the flow of the tape attaching method proceeds to the holding and dividing step ST2.

(Holding and Dividing Step)

Figure 5:
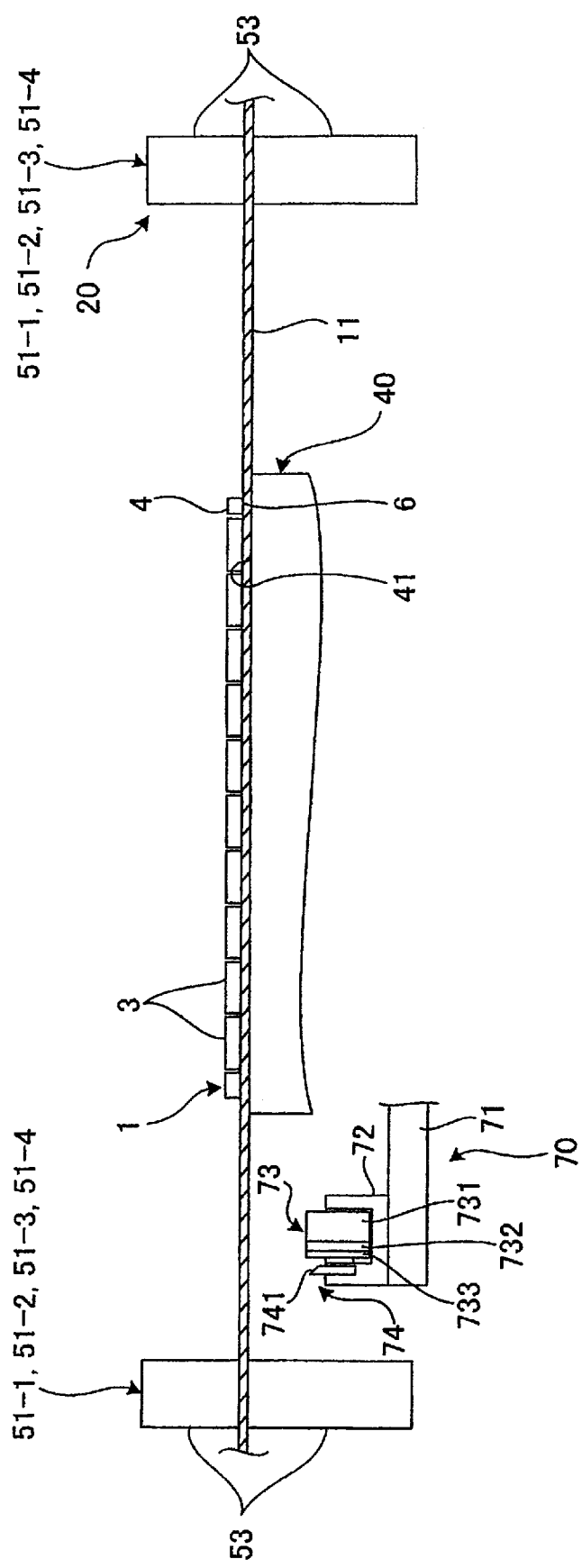
FIG. 5 is a side view of an essential part of the tape attaching apparatus, depicting a holding and dividing step included in the tape attaching method depicted in FIG. 4.

FIG. 5 is a side view of an essential part of the tape attaching apparatus 20, depicting the holding and dividing step of the tape attaching method depicted in FIG. 4. The holding and dividing step ST2 is the step of holding the adhesive tape 11 attached to the back side 6 of the workpiece 1 by using the holding units 51-1, 51-2, 51-3, and 51-4 of the tape attaching apparatus 20 and next expanding the adhesive tape 11 by operating the moving units (tape expanding units) 58-1, 58-2, 58-3 and 58-4 to thereby divide the workpiece 1 into the individual devices 3.

In the holding and dividing step ST2, the adhesive tape 11 attached to the back side 6 of the workpiece 1 having the modified layers 5 is previously placed on the upper surface 41 of the holding table 40 of the tape attaching apparatus 20, and the frame 10 is previously fixed to the lower surface 61 of the frame fixing unit 60. Further, in the holding and dividing step ST2, the frame fixing unit 60 is previously raised and the tape attaching and cutting unit 70 is previously lowered.

In the holding and dividing step ST2, the control unit 100 of the tape attaching apparatus 20 receives the processing content information input through the input unit by the operator and then receives an instruction of starting the processing operation from the operator. Thereafter, the control unit 100 controls the tape moving units 54 for the holding units 51-1, 51-2, 51-3, and 51-4 to thereby nip the adhesive tape 11 between the pair of nipping members 53 in each of the holding units 51-1, 51-2, 51-3, and 51-4, thus holding the adhesive tape 11. At this time, the pair of nipping members 53 in each of the holding units 51-1, 51-2, 51-3, and 51-4 are set in vertical position in such a manner that the adhesive tape 11 held between the pair of nipping members 53 is present in the same horizontal plane as that where the adhesive tape 11 placed on the upper surface 41 of the holding table 40 as depicted in FIG. 5.

Thereafter, the control unit 100 of the tape attaching apparatus 20 drives the motors 59-1 of the moving units 58-1, 58-2, 58-3, and 58-4 to move the holding units 51-1 and 51-2 in the first direction 21 so that they are moved away from each other and also to move the holding units 51-3 and 51-4 in the second direction 22 so that they are moved away from each other. As a result, the adhesive tape 11 is expanded both in the first direction 21 and in the second direction 22 by the movement of the holding units 51-1, 51-2, 51-3, and 51-4. Owing to the expansion of the adhesive tape 11, a tensile force is applied to the adhesive tape 11 both in the first direction 21 and in the second direction 22. When such a tensile force is applied to the adhesive tape 11 both in the first direction 21 and in the second direction 22, the workpiece 1 attached to the adhesive tape 11 is divided along each division line 2 where the modified layer 5 is formed as a break start point, thereby obtaining the individual devices 3 as depicted in FIG. 5. After dividing the workpiece 1 into the individual devices 3 as described above, the flow of the tape attaching method proceeds to the frame positioning step ST3.

(Frame Positioning Step)

Figure 6:
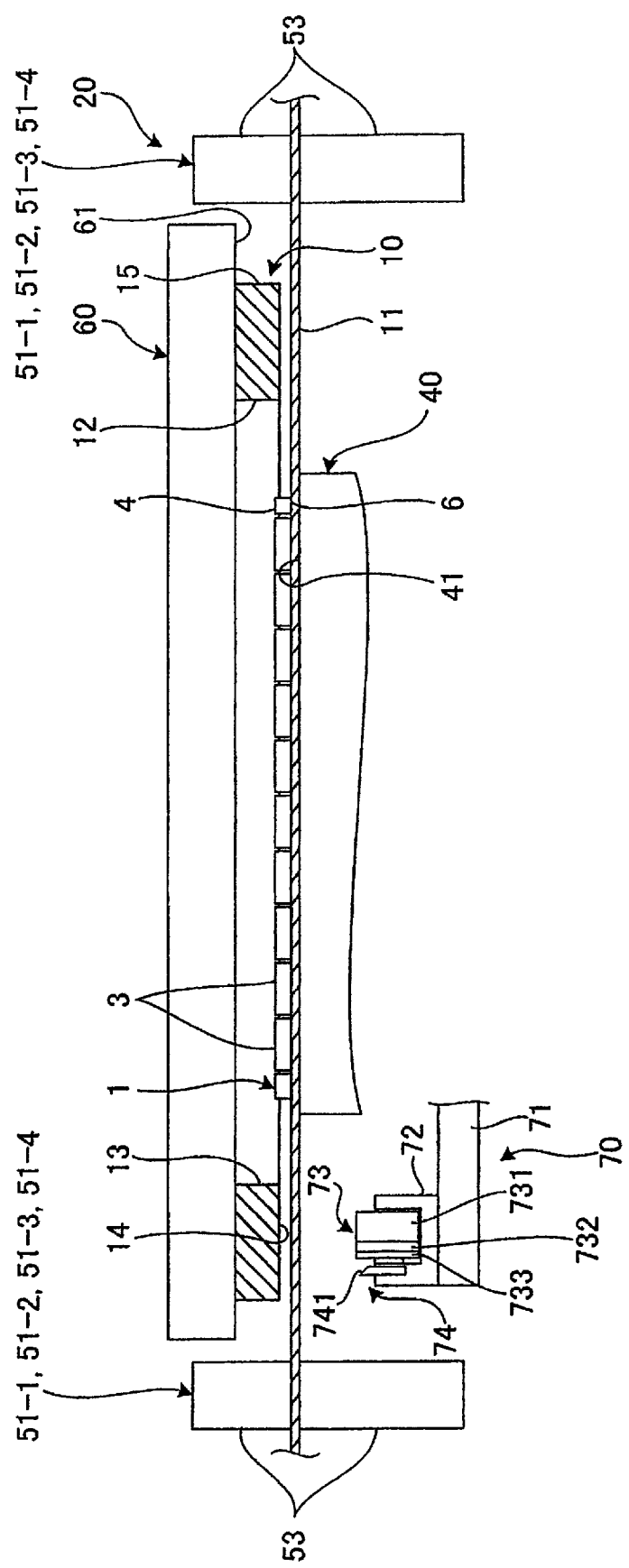
FIG. 6 is a side view similar to FIG. 5, depicting a frame positioning step included in the tape attaching method depicted in FIG. 4.

FIG. 6 is a side view similar to FIG. 5, depicting the frame positioning step of the tape attaching method depicted in FIG. 4. The frame positioning step ST3 is the step of positioning the frame 10 with a spacing defined between the frame 10 and the adhesive tape 11 in the condition where the inside opening 12 of the frame 10 is opposed to the workpiece 1 attached to the adhesive tape 11.

In the frame positioning step ST3, the control unit 100 of the tape attaching apparatus 20 lowers the frame fixing unit 60 to thereby lower the frame 10 fixed by the frame fixing unit 60 to a vertical position close to the adhesive tape 11, that is, with a spacing defined between the frame 10 and the adhesive tape 11 in the condition where the inside opening 12 is opposed to the front side 4 of the workpiece 1. In this preferred embodiment, as depicted in FIG. 6, the frame 10 is positioned with a spacing defined between the lower surface 14 of the frame 10 and the adhesive tape 11. After lowering the frame fixing unit 60 as described above, the flow of the tape attaching method proceeds to the tape attaching and cutting step ST4.

(Tape Attaching and Cutting Step)

Figure 7:
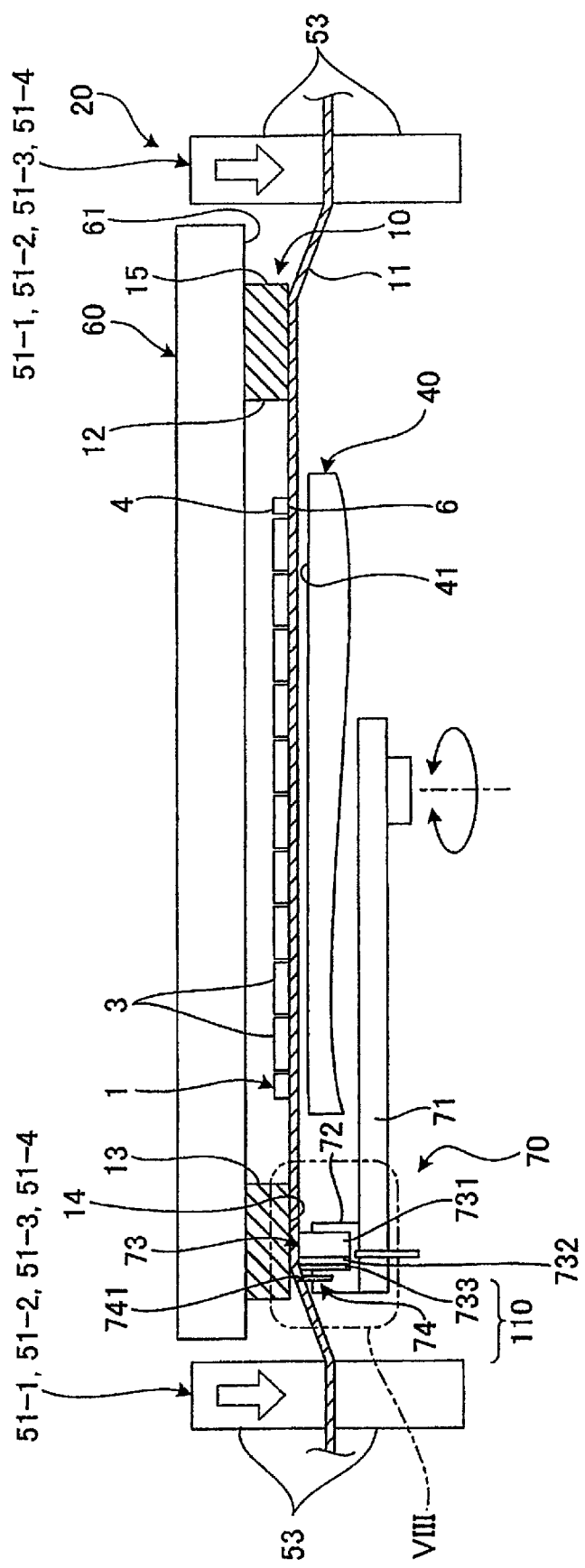
FIG. 7 is a side view similar to FIG. 5, depicting a tape attaching and cutting step included in the tape attaching method depicted in FIG. 4.
Figure 8:
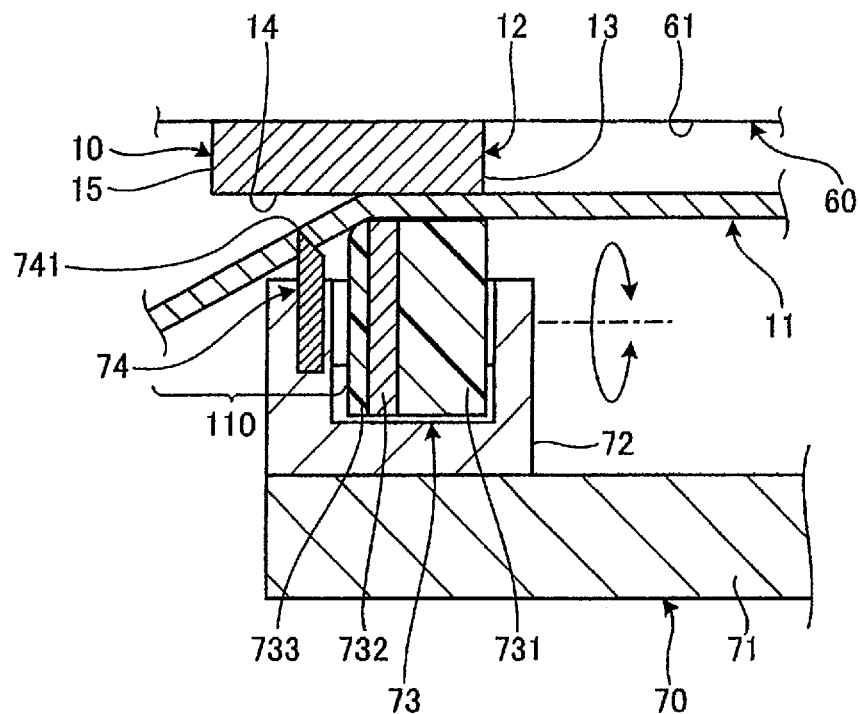
FIG. 8 is an enlarged view of a part VIII depicted in FIG. 7.

FIG. 7 is a side view similar to FIG. 5, depicting the tape attaching and cutting step of the tape attaching method depicted in FIG. 4. FIG. 8 is an enlarged view of a part VIII depicted in FIG. 7. The tape attaching and cutting step ST4 is the step of partially pressing the adhesive tape 11 against the frame 10 by using the roller 73 rotating along the inner circumference 13 of the frame 10, the adhesive tape 11 being previously spaced from the frame 10, thereby partially attaching the adhesive tape 11 to the frame 10, and also cutting the adhesive tape 11 in an area not coming into contact with the frame 10 on the axial outside of the roller 73 by using the cutter 74 in the condition where the cutting edge 741 of the cutter 74 is not in contact with the frame 10.

In the tape attaching and cutting step ST4, the control unit 100 of the tape attaching apparatus 20 operates all the tape moving units 54 to lower the pair of nipping members 53 of each of the holding units 51-1, 51-2, 51-3, and 51-4, the adhesive tape 11 being nipped by each pair of nipping members 53, and simultaneously to raise the tape attaching and cutting unit 70 as depicted in FIG. 7. As a result, the adhesive tape 11 is pressed on the lower surface 14 of the frame 10 at its radially inside area by the roller 73 and thereby attached to the frame 10, and the adhesive tape 11 is raised from the upper surface 41 of the holding table 40 as depicted in FIGS. 7 and 8.

Further, when each pair of nipping members 53 are lowered, a part 110 of the adhesive tape 11 is moved away from the lower surface 14 of the frame 10 between the roller 73 and each pair of nipping members 53. That is, this part 110 of the adhesive tape 11 is lowered under tension by each pair of nipping members 53. Accordingly, the upper end of the soft resin roller 733 of the roller 73 pressed on the adhesive tape 11 is deformed by this part 110 of the adhesive tape 11 in such a manner that the degree of deformation of the upper end of the soft resin roller 733 is larger on the radial outside of the frame 10 than that on the radial inside of the frame 10. Accordingly, when each pair of nipping members 53 are lowered, this part 110 of the adhesive tape 11 between the roller 73 and each pair of nipping members 53 is inclined downward from the upper end of the soft resin roller 733 toward each pair of nipping members 53 in the condition where the upper end of the soft resin roller 733 is deformed more on the radial outside of the frame 10 by this part 110 of the adhesive tape 11. The cutter 74 is located axially outside of the roller 73. Accordingly, the cutting edge 741 of the cutter 74 is located between the roller 73 and each pair of nipping members 53, so that the cutting edge 741 is forced into the part 110 of the adhesive tape 11, which part 110 is spaced from the lower surface 14 of the frame 10 and stretched between the upper end of the soft resin roller 733 and each pair of nipping members 53.

In the tape attaching and cutting step ST4, the control unit 100 of the tape attaching apparatus 20 rotates the arm member 71 about its longitudinal one end in the condition where the adhesive tape 11 is pressed on the frame 10 by the roller 73 and thereby attached to the frame 10 and the cutting edge 741 of the cutter 74 is forced into the adhesive tape 11. As a result, the roller 73 is rotated about its axis as rolling on the adhesive tape 11 under pressure in concert with the rotation of the arm member 71 about its longitudinal one end. Since the roller 73 is located at the longitudinal other end of the arm member 71, the roller 73 describes a circular movement path about the longitudinal one end of the arm member 71 in concert with the rotation of the arm member 71. Further, since the cutter 74 is located outside the roller 73 at the longitudinal other end of the arm member 71, the cutter 74 also describes a circular movement path about the longitudinal one end of the arm member 71 in concert with the rotation of the arm member 71 as cutting the adhesive tape 11 between the inner circumference 13 and the outer circumference 15 of the frame 10. In the tape attaching and cutting step ST4, the arm member 71 is rotated about its longitudinal one end by at least 360 degrees, so that the adhesive tape 11 is attached to the frame 10 over the whole of the inner circumference 13 of the frame 10 by the rolling pressure of the roller 73. At the same time, the adhesive tape 11 is cut by the cutter 74 along the inner circumference 13 of the frame 10 over the whole thereof at the position between the roller 73 and each pair of nipping members 53. After attaching the adhesive tape 11 to the frame 10 and cutting the adhesive tape 11 along the inner circumference 13 of the frame 10 over the whole thereof as described above, the flow of the tape attaching method is ended.

In this preferred embodiment, the control unit 100 of the tape attaching apparatus 20 operates all the tape moving units 54 at the same time to thereby simultaneously lower all the holding units 51-1, 51-2, 51-3, and 51-4 in the tape attaching and cutting step ST4, thereby simultaneously lowering each pair of nipping members 53 nipping the adhesive tape 11. As a modification, the control unit 100 may sequentially operate all the tape moving units 54 in such a manner that the holding units 51-1, 51-2, 51-3, and 51-4 are sequentially lowered in the order where the tape attaching and cutting unit 70 comes nearest to any one of the holding units 51-1 to 51-4 during the rotation of the arm member 71 in the tape attaching and cutting step ST4. That is, the control unit 100 may control the holding units 51-1, 51-2, 51-3, and 51-4 to sequentially lower each pair of nipping members 53 in the order where the roller 73 and the cutter 74 of the tape attaching and cutting unit 70 come nearest to any one of the holding units 51-1 to 51-4 during the rotation of the arm member 71.

Thus, the workpiece 1 is attached to the central area of the adhesive tape 11, and the peripheral area of the adhesive tape 11 is attached to the frame 10 in the condition where the workpiece 1 is exposed to the inside opening 12 of the frame 10. This frame 10 supporting the workpiece 1 through the adhesive tape 11 is next removed from the frame fixing unit 60 and transferred to the next process. Further, the control unit 100 of the tape attaching apparatus 20 operates all the motors 59-1 to move the holding units 51-1, 51-2, 51-3, and 51-4 to the original position set before expanding the adhesive tape 11 and then operates all the tape moving units 54 to cancel the holding of the remaining part (unwanted part) of the adhesive tape 11 by the holding units 51-1 to 51-4. Thereafter, the remaining part of the adhesive tape 11 removed from the holding units 51-1 to 51-4 is discarded.

In the tape attaching method and the tape attaching apparatus 20 according to this preferred embodiment, the adhesive tape 11 is pressed on the frame 10 by the roller 73 and thereby attached to the frame 10. At the same time, the adhesive tape 11 is cut at a portion outside the roller 73 by the cutter 74, in which this portion of the adhesive tape 11 is vertically spaced from the frame 11. Further, in the tape attaching method and the tape attaching apparatus 20, the cutting edge 741 of the cutter 74 is set at a vertical position lower than that of the upper end of the roller 73. In attaching the adhesive tape 11 to the frame 10, each pair of nipping members 53 nipping the adhesive tape 11 is lowered to move the part 110 of the adhesive tape 11 between the roller 73 and each pair of nipping members 53 away from the frame 10 in such a manner that this part 110 is inclined downward from the upper end of the roller 73 toward each pair of nipping members 53.

Accordingly, the cutting edge 741 of the cutter 74 can be forced into this part 110 of the adhesive tape 11 at a position between the inner circumference 13 and the outer circumference 15 of the frame 10 without contact with the frame 10, thereby cutting the adhesive tape 11 at this part 110 vertically spaced from the frame 10. As a result, in attaching the adhesive tape 11 to the frame 10 and cutting the adhesive tape 11 along the frame 10, it is possible to suppress the problem that the frame 10 may be damaged by the cutter 74, so that the number of repetitions of use of the frame 10 can be increased.

Further, in the tape attaching method and the tape attaching apparatus 20, the adhesive tape 11 is cut between the inner circumference 13 and the outer circumference 15 of the frame 10 by the cutter 74. Accordingly, the area of the adhesive tape 11 to be attached to the frame 10 can be suppressed. As a result, it is possible to reduce the amount of the adhesive layer of the adhesive tape 11 left on the frame 10 after peeling the adhesive tape 11 from the frame 10. Further, since the area of the adhesive tape 11 to be attached to the frame 10 can be suppressed, the adhesive tape 11 can be easily peeled from the frame 10 without using a peeling mechanism.

Further, in the tape attaching method and the tape attaching apparatus 20, the roller 73 includes the hard resin roller 731 and the soft resin roller 733 softer than the hard resin roller 731, the soft resin roller 733 being located outside the hard resin roller 731 in the radial direction of the frame 10. Accordingly, in attaching the adhesive tape 11 to the frame 10 by raising the roller 73 and lowering each pair of nipping members 53, the upper end of the soft resin roller 733 can be deformed by the part 110 of the adhesive tape 11 between the roller 73 and each pair of nipping members 53. As a result, in attaching the adhesive tape 11 to the frame 10 by raising the roller 73 and lowering each pair of nipping members 53, the part 110 of the adhesive tape 11 between the roller 73 and each pair of nipping members 53 can be inclined downward from the upper end of the soft resin roller 733 toward each pair of nipping members 53 and accordingly can be vertically spaced from the frame 10. Accordingly, the adhesive tape 11 can be cut by the cutter 74 with the cutting edge 741 being kept in noncontact with the frame 10.

As described above, the part 110 of the adhesive tape 11 between the roller 73 and each pair of nipping members 53 can be inclined downward from the upper end of the soft resin roller 733 toward each pair of nipping members 53. Accordingly, there is no possibility that the adhesive layer of this part 110 may be attached to the frame 10. As a result, the amount of the adhesive layer of the adhesive tape 11 left on the frame 10 in its peripheral area can be reduced, so that the adhesive tape 11 can be easily peeled from the frame 10 after using the frame 10.

Further, in the tape attaching method and the tape attaching apparatus 20, the roller 73 further includes the hard metal roller 732 between the hard resin roller 731 and the soft resin roller 733. Accordingly, the adhesive tape 11 can be reliably pressed on the frame 10 and thereby attached thereto by the roller 73.

Further, in the tape attaching method and the tape attaching apparatus 20, each of the holding units 51-1, 51-2, 51-3, and 51-4 of the adhesive tape fixing unit 50 includes the tape moving unit 54 for vertically moving each pair of nipping members 53 nipping the adhesive tape 11 away from the frame 10. Accordingly, in attaching the adhesive tape 11 to the frame 10 by using the roller 73 and cutting the adhesive tape 11 by using the cutter 74, each pair of nipping members 53 nipping the adhesive tape 11 can be lowered by operating each tape moving unit 54, so that the part 110 of the adhesive tape 11 between the roller 73 and each pair of nipping members 53 can be inclined downward from the upper end of he roller 73 toward each pair of nipping members 53.

Figure 9:
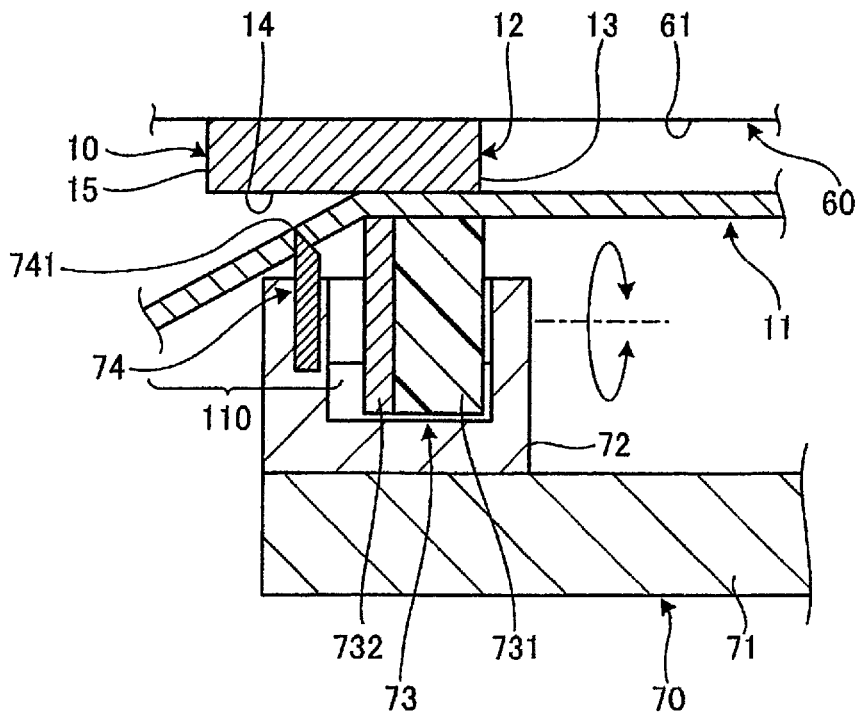
FIG. 9 is an enlarged view similar to FIG. 8, depicting a modification of this preferred embodiment.

The present invention is not limited to the above preferred embodiment, but various modifications may be made without departing from the sprit and scope of the present invention. For example, while the roller 73 includes the hard resin roller 731, the hard metal roller 732, and the soft resin roller 733 in this preferred embodiment, the configuration of the roller 73 may be modified as depicted in FIG. 9. In this modification depicted in FIG. 9, the roller 73 includes the hard resin roller 731 and the hard metal roller 732, and does not include the soft resin roller 733. FIG. 9 is a sectional view similar to FIG. 8, depicting this modification. In FIG. 9, the same parts as those depicted in FIG. 8 are denoted by the same reference numerals, and the description thereof will be omitted herein.

Further, the tape attaching apparatus 20 according to the present invention may include a roller for pressing the adhesive tape 11 against the workpiece 1 without using the holding table 40. In this case, a protective tape is attached to the front side 4 of the workpiece 1 having the modified layer 5 extending along each division line 2, and a vacuum pad is used to suck the workpiece 1 through the protective tape. The workpiece 1 is transferred to the upper side of the adhesive tape 11 by the vacuum pad, and the adhesive tape 11 is pressed on the back side 6 of the workpiece 1 by the roller located under the adhesive tape 11 in the condition where the workpiece 1 is held by the vacuum pad under suction. Thereafter, the adhesive tape 11 is similarly expanded in the four directions as in this preferred embodiment, and the frame 10 is next mounted on the adhesive tape 11.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A tape attaching method for mounting an adhesive tape to an annular frame having an inside opening to thereby support a plate-shaped workpiece through said adhesive tape to said frame in said inside opening of said frame, said tape attaching method comprising:
    an adhesive tape attaching step of attaching said adhesive tape to said workpiece, said adhesive tape being larger in size than said frame;
    a frame positioning step of positioning said frame with a spacing defined between said frame and said adhesive tape in a condition where said inside opening of said frame is opposed to said workpiece attached to said adhesive tape; and
    a tape attaching and cutting step of partially pressing said adhesive tape against said frame by using a roller rotating along the inner circumference of said frame defining said inside opening, thereby partially attaching a portion of said adhesive tape to said frame, and also cutting another portion of said adhesive tape in an area of said tape that is not in contact with said frame by using a cutter having a cutting edge where said cutting edge of said cutter is not in contact with said frame, said cutter being arranged adjacent to said roller and on a side of said roller that is closest to an outer side of said frame.

2. The tape attaching method according to claim 1, wherein said roller includes a hard area and a soft area, said soft area being softer than said hard area.

3. The tape attaching method according to claim 1, wherein said tape attaching and cutting step further includes nipping said adhesive tape by a pair of nipping members of a holding unit, and raising or lowering said adhesive tape relative to said frame using said holding unit.

4. The tape attaching method according to claim 1, wherein said tape attaching and cutting step further includes nipping said adhesive tape by a plurality of pairs of nipping members associated with a plurality of holding units, and raising or lowering said adhesive tape relative to said frame using said plurality of holding units.

* * * * *